(12) United States Patent
Turicchi, Jr. et al.

(10) Patent No.: US 8,661,283 B2
(45) Date of Patent: Feb. 25, 2014

(54) POWER DISTRIBUTION UNIT-DEVICE CORRELATION

(75) Inventors: Thomas E. Turicchi, Jr., Dallas, TX (US); Clifford A. McCarthy, Plano, TX (US); Charles W. Cochran, Spring, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 193 days.

(21) Appl. No.: 13/259,118

(22) PCT Filed: Mar. 25, 2009

(86) PCT No.: PCT/US2009/038190
§ 371 (c)(1),
(2), (4) Date: Sep. 22, 2011

(87) PCT Pub. No.: WO2010/110787
PCT Pub. Date: Sep. 30, 2010

(65) Prior Publication Data
US 2012/0117392 A1    May 10, 2012

(51) Int. Cl.
*G06F 1/00* (2006.01)
(52) U.S. Cl.
USPC .......................................... 713/340; 700/286

(58) Field of Classification Search
USPC ...................... 713/340, 300, 310; 702/60–62;
700/286, 291, 295, 297
See application file for complete search history.

(56) References Cited

U.S. PATENT DOCUMENTS

| 7,751,921 | B2 * | 7/2010 | Sakamoto et al. ............ 700/108 |
| 2005/0071092 | A1 | 3/2005 | Farkas et al. |
| 2006/0044117 | A1 * | 3/2006 | Farkas et al. ............. 340/310.11 |
| 2007/0276548 | A1 | 11/2007 | Uzunovic et al. |
| 2008/0244281 | A1 | 10/2008 | Felter et al. |

OTHER PUBLICATIONS

He Wei, et al.; Power Quality Disturbances Classification Based on Second Generation of Wavelet Transform and Vector Quantization Theory, Power System Technology, vol. 31, pp. 82-86.

* cited by examiner

*Primary Examiner* — Clifford Knoll (57) ABSTRACT

Apparatus, methods, and other embodiments associated with providing a correlation between a power distribution unit(s) and a device(s) are described. One example method includes storing first time series data that identifies, on a per power distribution unit (PDU) basis, current drawn from a set of PDUs. The example method may include storing second time series data that identifies, on a per device basis, power used by a set of related devices. With the two time series data available, the method may then provide a PDU-device correlation signal that identifies a correlation between current drawn from a PDU and power used by a device.

15 Claims, 10 Drawing Sheets

POWER DISTRIBUTION UNIT-DEVICE CORRELATION

BACKGROUND

In a power distribution network, devices are powered by one or more other devices. For example in a computer datacenter, a power distribution unit (PDU) can be used to provide electricity to one or more servers. Conventionally it has been difficult, if even possible, to identify which servers are powered by which PDUs, which PDUs are powered by which power panels (PPs), which PPs are powered by which feeds, and so on. Having an understanding of a power distribution network topology in, for example, a datacenter, is useful for troubleshooting power problems, managing capacity, configuring group power capping, verifying redundancy, facilitating high availability, and so on.

Conventionally, electricity and/or power distribution systems network topology maps have been mapped by hand if at all to create a network power topology map. However, due to the time needed to hand-map a power network topology and the need to constantly update the power network topology map when new components are added and/or when existing components are relocated, power network topology mapping is time intensive and difficult to maintain. A technician may manually trace wire connections from source to destination, or vice versa, and manually record the connections. This is a time consuming and error prone process that produces a typically inaccurate and/or incomplete topology that can get out of date.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
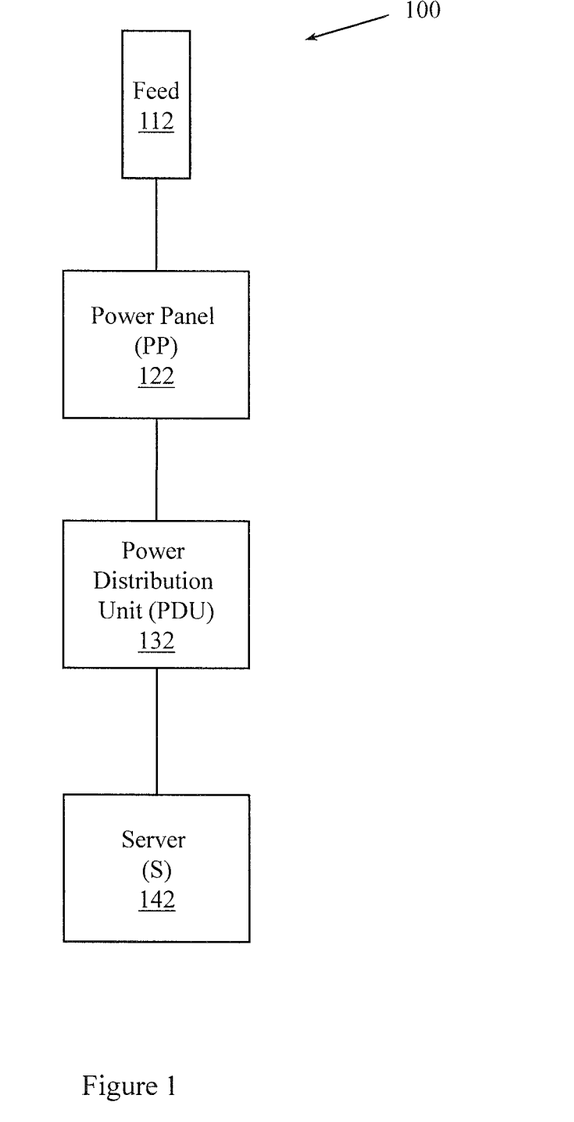
FIG. 1 illustrates an example embodiment of a power distribution network in a datacenter.

Before considering the embodiments discussed herein in greater detail, first consider the following examples. Figure one illustrates a simple power distribution network 100 in a datacenter. In this simplest case, a single feed 112 provides electricity to a single power panel (PP) 122 which in turn provides electricity to a single power distribution unit (PDU) 132 which in turn provides electricity to a single server 142. If all power distribution networks were this simple, issues associated with identifying connections between servers, storage devices, networking devices, PDUs, PPs, feeds, and so on would be minimal. However, a power distribution network associated with real world installations (e.g., a datacenter) is rarely, if ever, so simple.

Figure 2:
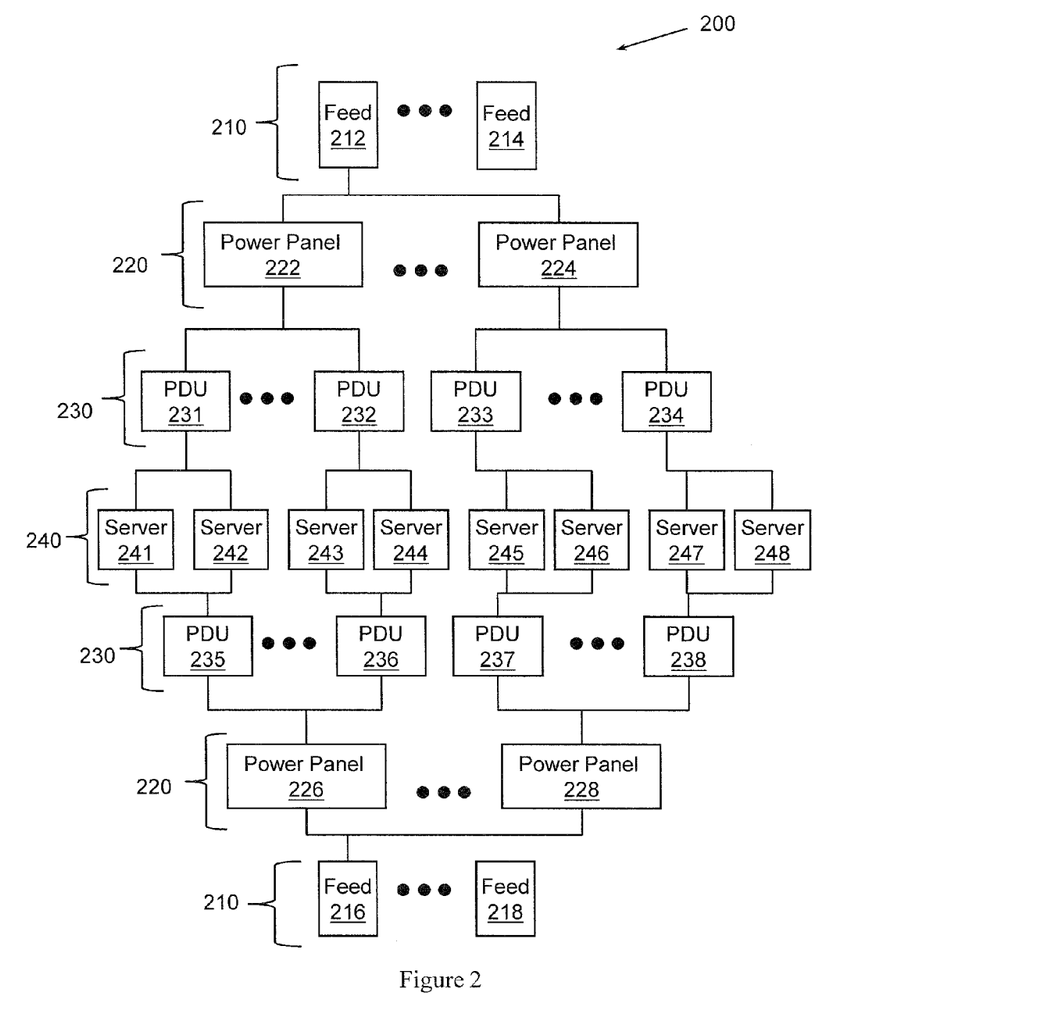
FIG. 2 illustrates a more complicated embodiment power distribution network in a datacenter.

Figure two illustrates the more general case of a highly interconnected power distribution network 200 in a datacenter. In power distribution network 200, a number of feeds (e.g., 212, 214, . . . 218) collectively referred to as feeds 210, bring electricity into a datacenter. While a datacenter is described, it is to be appreciated that more generally feeds 210 can provide electricity to other related collections of power distribution and power consuming items. It is relatively straightforward to keep track of what feeds are available in a data center because the number of feeds is generally relatively low.

In network 200, the feeds 210 provide electricity to a number of power panels (e.g., 222, 224, 228) that are collectively referred to as PPs 220. In different examples, a single feed may be connected to one or more power panels. Once again the number of power panels 220 may be relatively low and it may not be that difficult to track the power panels. However, even with a small number of feeds and a small number of power panels, there can be a large and sometimes confusing set of connections between feeds and power panels.

In topology 200, the power panels 220 may provide electricity to a number of PDUs (e.g., 231, 232, . . . 238) that are collectively referred to as PDUs 230. Once again, a single power panel may be connected to a number of PDUs. Additionally there may be a relatively large number of PDUs. Therefore, there can be a large and confusing number of connections between power panels and PDUs.

In power distribution network 200, the PDUs 230 may provide electricity to a number of servers (e.g., 241, 242, . . . 248) that are collectively referred to as servers 240. A 3 phase PDU may distribute power as a 3 phase set of single phase outlets to blade enclosures, storage arrays, or network chassis or discrete single phase outlets per server, storage device or network device. The server, storage device, or network device may be referred to generically as a device. The load phases are managed in order to maintain phase load balancing. Once again, a single PDU may be connected to a number of servers and a server may be connected to one or more PDUs. Similarly, a single PDU may be connected to a number of devices and a device may be connected to one or more PDUs. This can lead to a very large and potentially very confusing set of connections between PDUs and servers or more generally between PDUs and devices. Additionally, servers and devices may tend to be relocated, which may cause an initial "map" of a power topology to quickly get out of date. Yet knowing which PDUs are providing power to which servers can be important to maintaining high availability in a data center. One skilled in the art will appreciate that while a single layer of servers 240 is illustrated, that multiple layers of servers, of PDUs, of power panels, and so on, may be present in a power distribution topology.

It is difficult to identify which servers are powered by which PDUs, which PDUs are powered by which PPs, which PPs are powered by which feeds, and so on. Conventional tools do not include automated means to discover a power network topology. Yet having an understanding of a power distribution network topology in, for example, a datacenter, is useful for troubleshooting power problems, managing capacity, configuring group power capping, verifying redundancy, facilitating high availability, and so on.

Example systems and methods described herein automatically discover a datacenter power distribution network topology. Example systems and methods correlate electrical activity at one element of the power distribution network with electrical activity at another element(s) of the power distribution network. For example, a correlation may be made between power usage measured at a server and current drawn from a PDU, between a networking device and a PDU, between a storage device and a PDU, and so on. Similarly, a correlation may be made between current drawn from a PDU and current provided by a PP. While power and current are described, it is to be appreciated that in different examples correlations between different measurements available in the power distribution network may be employed.

PDUs distribute power in a datacenter to a group of computing and/or networking equipment. A PDU may provide power to 4, 8, 16, or more devices. A PDU may monitor the amount of power it consumes. This may be measured in amps and watts. A PDU may also monitor the amount of current drawn from it by consuming devices. The monitoring may include recording device identity, device capacity, actual measurement data, average measurements over time, a time at which the actual measurement data was recorded, and so on. In one example, a PDU may monitor an aggregate of the current drawn from the PDU and current per power phase. In another example, a PDU may monitor current drawn on a per port basis. The monitoring may result in data being provided to a correlation logic, to a data store, and so on.

Servers consume power. A server may also monitor the amount of power it consumes. This may be measured in amps and watts. Additionally, and/or alternatively, a server may monitor its central processing unit (CPU) utilization. Generally, a relationship between CPU utilization and power consumption can be understood for a server. The server monitoring may include recording device identity, device capacity, actual measurement data, a time at which the actual measurement data was recorded, and so on. The monitoring may result in data being provided to a correlation logic, to a data store, and so on.

A server may be connected to one or more PDUs. For both the PDUs and the servers, data may be recorded over time and provided as time series data. The time series data may identify, for example, average power usage and peak power usage. Over time, the load on a server varies. The load on different servers may vary in unique ways. Thus, over time, a server's historical power usage may create a unique fingerprint. With both sets of data available, a correlation between power consumed at a server and current provided by a PDU may be made. For example, pattern recognition and/or pattern matching algorithms may detect correlations in the time series data.

Figure 10:
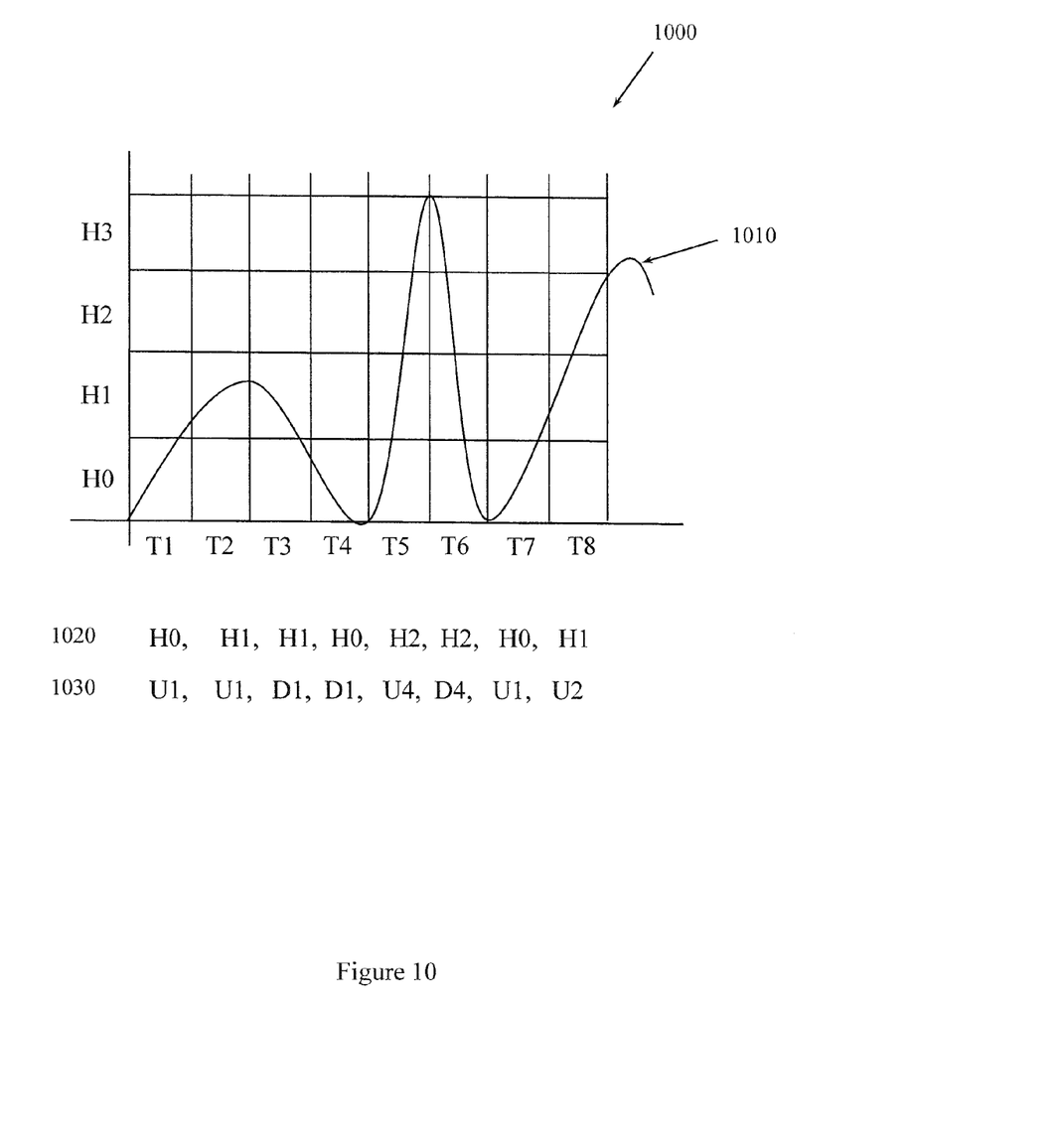
FIG. 10 illustrates an example embodiment of a power consumption waveform produced at a server, hash values derived from the waveform, and relative difference values derived from the waveform.

FIG. 10 illustrates how actual measurement data may be digitized to facilitate pattern recognition and/or pattern matching. In FIG. 10, a graph 1000 illustrates an analog curve 1010 that represents the power consumed at a server. While a server is described, one skilled in the art will appreciate that more generally curve 1010 represents power consumed by a power consuming device. While power is described, one skilled in the art will appreciate that other measurements of other electrical attributes (e.g., voltage, current) may be made.

Curve 1010 is illustrated being sampled at eight different time periods, T1 through T8. In one example, curve 1010 is digitized by breaking the curve into a series of four discrete values H0 through H3. While four intervals are illustrated, one skilled in the art will appreciate that a greater and/or lesser number of intervals may be employed. Similarly, while eight time intervals are illustrated, one skilled in the art will appreciate that a greater and/or lesser number of time intervals having longer and/or shorter durations and that are associated with different sampling rates may be employed. Signature 1020 is a time series of the values at times T1 through T8. In another example, curve 1010 is digitized by identifying how the curve changed during the sample period. For example, at time T1 curve 1010 went up one interval, while at time T3 curve 1010 went down one interval. Signature 1030 is a time series of the relative change values at times T1 through T8. One skilled in the art will appreciate that other analog to digital conversions may be employed.

With the two signatures available, and with time information available for the times associated with measurement points from which the signatures were generated, pattern matching and/or other correlation techniques may be employed to determine whether a correlation between a server signature and a PDU signature exists. If so, then a correlation signal may be provided that identifies either a connection between a server and a PDU, a likelihood that a connection exists between a server and a PDU, and so on. One skilled in the art will appreciate that connections between other elements in the topology (e.g., network device to PDU, storage device to PDU, PDU to PP, PP to feed) may be identified using the same general techniques.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

ASIC: application specific integrated circuit.
CD: compact disk.
CD-R: CD recordable.
CD-RW: CD rewriteable.
DVD: digital versatile disk and/or digital video disk.
HTTP: hypertext transfer protocol.
LAN: local area network.
PCI: peripheral component interconnect.
PCIE: PCI express.

RAM: random access memory.
DRAM: dynamic RAM.
SRAM: static RAM.
ROM: read only memory.
PROM: programmable ROM.
EPROM: erasable PROM.
EEPROM: electrically erasable PROM.
USB: universal serial bus.
WAN: wide area network.

"Computer component", as used herein, refers to a computer-related entity (e.g., hardware, firmware, software in execution, combinations thereof). Computer components may include, for example, a process running on a processor, a processor, an object, an executable, a thread of execution, and a computer. A computer component(s) may reside within a process and/or thread. A computer component may be localized on one computer and/or may be distributed between multiple computers.

"Computer communication", as used herein, refers to a communication between computing devices (e.g., computer, personal digital assistant, cellular telephone) and can be, for example, a network transfer, a file transfer, an applet transfer, an email, an HTTP transfer, and so on. A computer communication can occur across, for example, a wireless system (e.g., IEEE 802.11), an Ethernet system (e.g., IEEE 802.3), a token ring system (e.g., IEEE 802.5), a LAN, a WAN, a point-to-point system, a circuit switching system, a packet switching system, and so on.

"Computer-readable medium", as used herein, refers to a medium that stores signals, instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Logic", as used herein, includes but is not limited to hardware, firmware, software in execution on a machine, and/or combinations of each to perform a function(s) or an action(s). and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, software). Logical and/or physical communication channels can be used to create an operable connection.

"Signal", as used herein, includes but is not limited to, electrical signals, optical signals, analog signals, digital signals, data, computer instructions, processor instructions, messages, a bit, a bit stream, or other means that can be received, transmitted and/or detected.

"Software", as used herein, includes but is not limited to, one or more executable instruction that cause a computer, processor, or other electronic device to perform functions, actions and/or behave in a desired manner. "Software" does not refer to stored instructions being claimed as stored instructions per se (e.g., a program listing). The instructions may be embodied in various forms including routines, algorithms, modules, methods, threads, and/or programs including separate applications or code from dynamically linked libraries.

"User", as used herein, includes but is not limited to one or more persons, software, computers or other devices, or combinations of these.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 3:
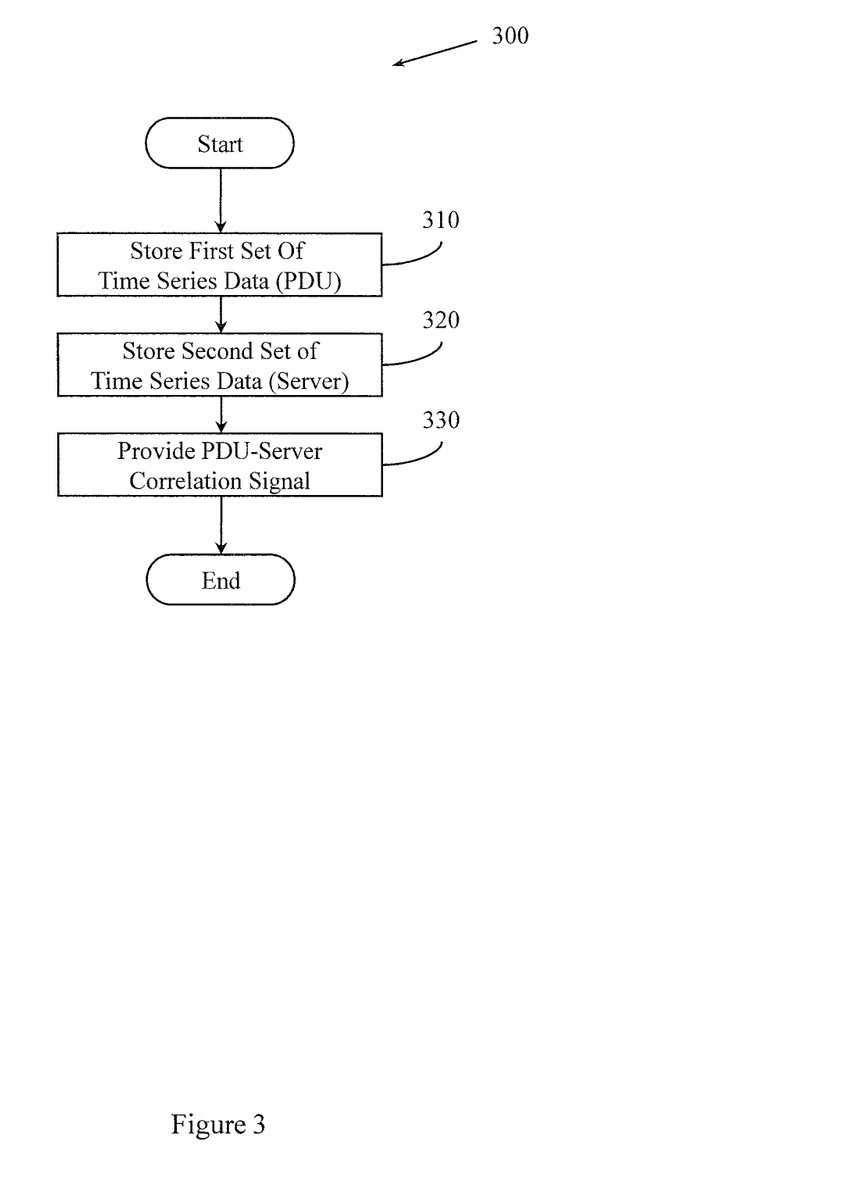
FIG. 3 illustrates an example embodiment of a method associated with automatic power distribution network topology discovery.

FIG. 3 illustrates a method 300 associated with automatic power distribution network topology discovery. Method 300 may include, at 310, storing a first set of time series data. This first set of time series data identifies power usage associated with a set of related PDUs. In one example, the data represents power usage on a per PDU basis. The data may include measurements of watts, amps, and so on. While power is described, one skilled in the art will appreciate that other measures associated with electrical activity (e.g., voltage, current, power factor, VA, Watts) may be employed. In one example, a member of the first set of time series data identifies the level of current drawn by a member of the set of related PDUs as a discrete value. In another example, the level of current drawn is represented by a relative change value. FIG. 10 illustrates examples of power to discrete value conversion and current to relative change conversion.

The first set of time series data may include, for example, a PDU identifier, a PDU current capacity, a PDU current measurement, a time stamp, and so on. The data may be recorded for different time intervals and at different sampling rates. The data may represent peak usages, average usages, and so on. The time stamp facilitates aligning PDU signature data to server signature data, which in turn facilitates pattern matching. The pattern matching is possible because of the observation that, over time, a server workload demand tends to be unique from other server workload demands.

Method 300 may also include, at 320, storing a second set of time series data. The second set of time series data identifies power used by a set of related servers. The power level may be recorded on a per server basis. In one example, a member of the second set of time series data identifies the power used by a member of the set of related servers as a discrete value. In another example, the power level is represented by a relative change value, by a percentage of maximum CPU usage, and so on. The second set of time series data may include a server identifier, a maximum server power consumption, a server power consumption measurement, a server CPU utilization measurement, a time stamp, and so on. The data may be recorded for different time intervals and using different sampling rates. The data may represent peak usages, average usages, and so on. The data may include measurements of amps, watts, CPU utilization percentage, and so on. While method 300 is directed at servers, one skilled in the art will appreciate that more generally method 300 can be directed at devices (e.g., servers, network devices, storage devices).

Method 300 may also include, at 330, providing a PDU-device correlation signal. The PDU-device correlation signal identifies a correlation between, for example, current drawn from a member of the set of related PDUs and power used by a member of the set of related devices. While current drawn and power used are described, one skilled in the art will appreciate that other correlation signals may be employed. For example, correlations between amplitudes, between frequencies, between power usages, and so on, may be provided. In another embodiment, a PDU-device correlation signal can also be provided that identifies a connection between a PDU and a device by one or more of, power load phase, and/or panel breaker pole as a function of correlating the suspected power event and the actual power event based at least in part on PDU event data and/or other event data.

In one example, the first set of time series data identifies current drawn on a per-PDU per-outlet basis. In this example, the PDU-device correlation signal identifies a correlation between current drawn from an outlet on a member of the set of related PDUs and power used by a member of the set of devices.

While FIG. 3 illustrates various actions occurring in serial, it is to be appreciated that various actions illustrated in FIG. 3 could occur substantially in parallel. By way of illustration, a first process could store time series data associated with a PDU, a second process could store time series data associated with a device, and a third process could compare the data to provide the correlation signal. While three processes are described, it is to be appreciated that a greater and/or lesser number of processes could be employed and that lightweight processes, regular processes, threads, and other approaches could be employed.

In one example, a method may be implemented as computer executable instructions. Thus, in one example, a computer-readable medium may store computer executable instructions that if executed by a machine (e.g., processor) cause the machine to perform method 300. While executable instructions associated with method 300 are described as being stored on a computer-readable medium, it is to be appreciated that executable instructions associated with other example methods described herein may also be stored on a computer-readable medium.

Figure 4:
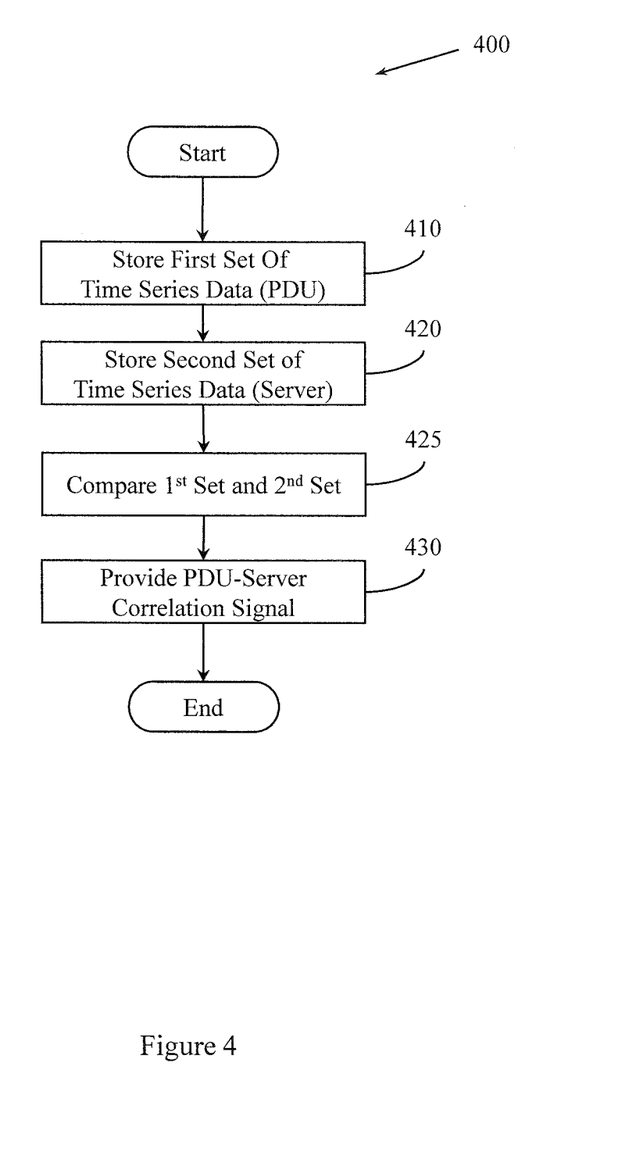
FIG. 4 illustrates another example embodiment of a method associated with automatic power distribution network topology discovery.

FIG. 4 illustrates a method 400 associated with automatic power distribution network topology discovery. Method 400 includes several actions similar to those described in connection with method 300 (FIG. 3). For example, method 400 includes, at 410, storing a first set of time series data, storing a second set of time series data at 420, and providing a correlation signal at 430. However, method 400 describes in greater detail how the correlation signal is produced. Method 400 specifically calls out, at 425, comparing the first set of time series data and the second set of times series data. This is contrasted with the approach taken in method 500 (FIG. 5), where the two sets of time series data are processed to produce a third time series data upon which correlation is based.

In one example, the PDU-server correlation signal results from comparing members of the first set of time series data to members of the second set of time series data at 425. The comparison facilitates correlating, for example, current drawn to power used. Comparing members of the first set of time series data to members of the second set of time series data may include, for example, pattern matching. The pattern matching may be facilitated by time stamps in the time series data that facilitate aligning server signatures with PDU signatures.

To illustrate how the comparing may occur, in one example, PDU traces Pn and server traces Sm may be acquired. The traces may be digitized representations of actual measurements. The digitized representations may be, for example, hash signatures, relative difference signatures, and so on. The traces may be aligned using acquisition time information (e.g., time stamp) available in the traces. An ordered list of servers may be created, where the list is ordered based on the best fit to a server trace. Some workloads are highly correlated, and thus some traces may be similar. However, some workloads may not be so highly correlated and thus, a second list may be created for traces for which greater disambiguation is desired. The disambiguation may include repeating signature acquisition, signature comparison, and so on, using longer signatures associated with longer sample times, using different signatures associated with different sample times, and so on. While method 400 is directed at servers, one of ordinary skilled in the art will appreciate that more generally method 400 can be directed at devices (e.g., servers, network devices, storage devices).

Figure 5:
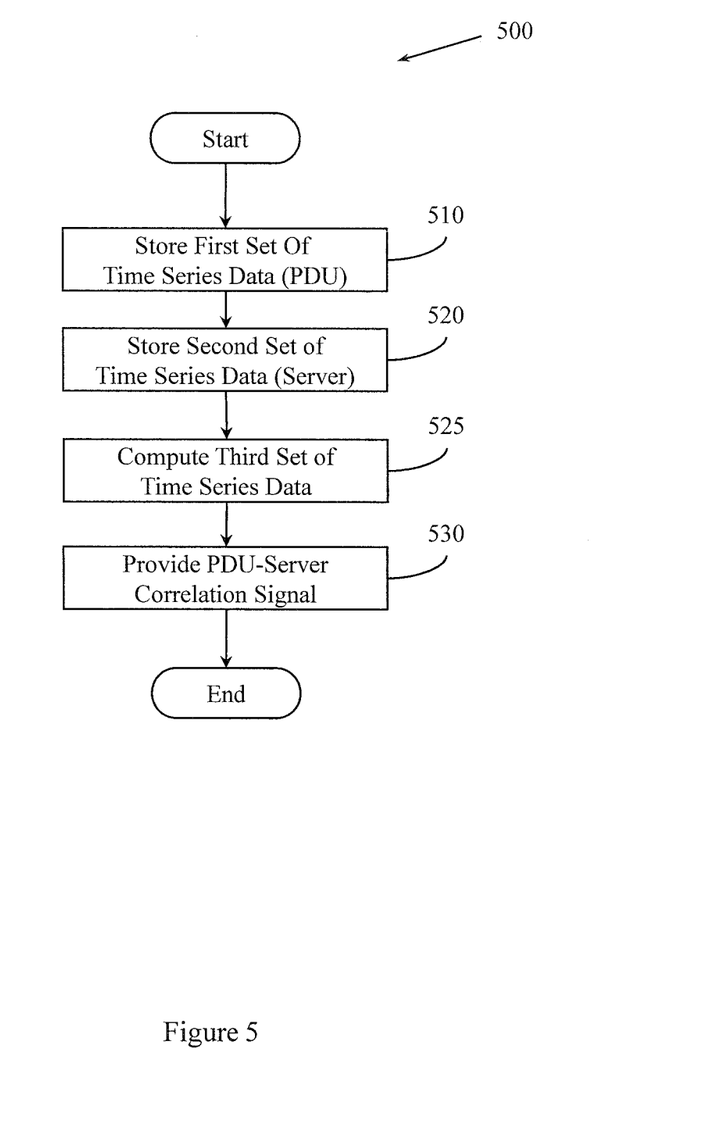
FIG. 5 illustrates another example embodiment of a method associated with automatic power distribution network topology discovery.

FIG. 5 illustrates a method 500 associated with automatic power distribution topology discovery. Method 500 includes several actions similar to those described in connection with method 300 (FIG. 3). For example, method 500 includes, at 510, storing a first set of time series data, storing a second set of time series data at 520, and providing a correlation signal at 530. However, method 500 describes a different approach for providing the correlation signal. Method 500 specifically calls out, at 525, computing a third time series data from the first set of time series data and the second set of times series data. This is contrasted with the direct comparison approach taken in method 400 (FIG. 4), where the two sets of time series data are compared directly without creating the third time series to identify correlations.

In one example, computing the third time series data includes performing a division that involves elements of the first time series data and elements of the second time series data. For example, a meta-trace PnSm may be created by dividing a PDU trace Pn[x] by a server trace Sm[x]. The division facilitates accounting for systematic power supply measurement errors. Dividing the PDU measurement by the server measurement can factor out the power supply measurement errors. While division is described, one skilled in the art will appreciate that other mathematical operations that accept two time series inputs and produce a single time series output may be employed.

A standard deviation can be calculated for metatraces PnSm. Then, an ordered list of servers, sorted, for example, from the least standard deviation to the highest standard deviation, can be created for power supply measurement samples [1 . . . N]. This list will be a list of "best fit" of server traces to power supply measurement traces. Some server workloads are highly correlated, and thus some traces may be similar. These traces may be singled out for closer examination. For a power supply, if it has multiple metatraces PnSm whose standard deviation is less than a threshold, then the two samples may be collapsed into a single sample. The single sample, the new meta-sample, may then be marked as a multi-trace sample for which further disambiguation may be performed.

Providing the correlation signal may include selecting the best match between members of ordered lists associated with power supplies and servers. The ordered lists may identify an element (e.g., server, power supply) and a metatrace that matched best. Matching algorithms (e.g., Gale-Shipley pairing) may be used to select the best matches between elements. One skilled in the art will appreciate that other pattern matching and pattern recognition approaches may be employed.

A device may include two or more power supplies. It may be desirable to have the different power supplies receive power from different PDUs. This may improve redundancy which may in turn improve high availability, failover processing, and so on. Therefore, in one example, the correlation signal described herein may also indicate whether a server is consuming power from two or more PDUs.

In one embodiment, a PDU may have multiple power phase inputs distributed as multiple or single power phase outputs. One or more outlets may be assigned to a particular power phase in a wye configuration or a pair of power phases in a delta configuration. Therefore, in one example, the correlation signal described herein may also indicate whether a server/device is consuming power from a particular power phase or a set of power phases.

Figure 6:
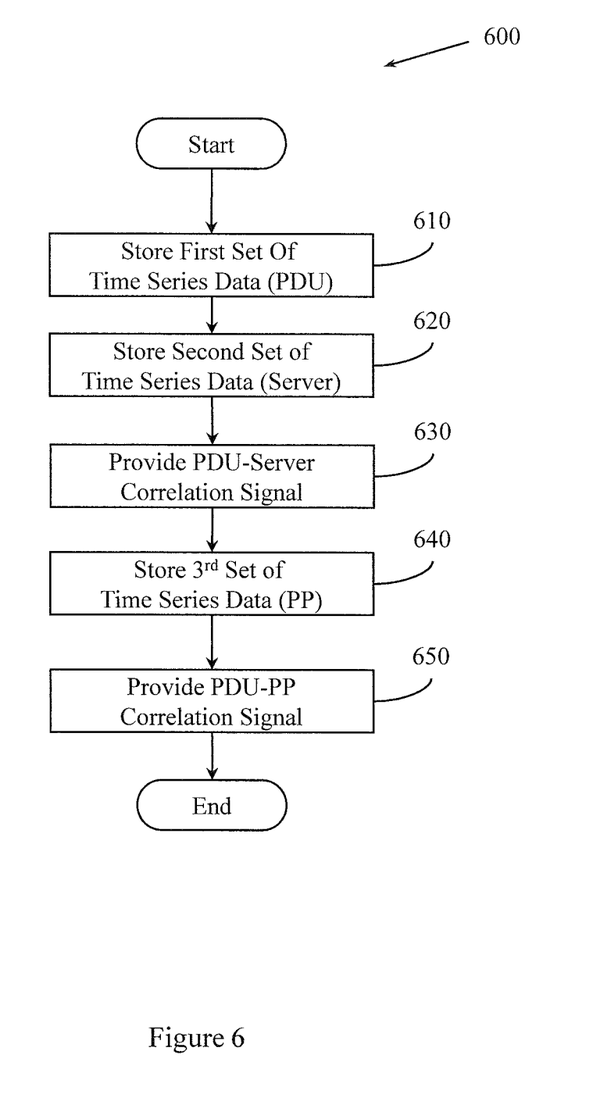
FIG. 6 illustrates another example embodiment of a method associated with automatic power distribution network topology discovery.

FIG. 6 illustrates a method 600 associated with automatic power distribution network topology discovery. Method 600 includes several actions similar to those described in connection with method 300 (FIG. 3). For example, method 600 includes, at 610, storing a first set of time series data, storing a second set of time series data at 620, and providing a PDU-device correlation signal at 630. However, method 600 describes additional actions associated with discovering correlations between other elements of a power distribution network.

Method 600 includes, at 640, storing a third set of time series data that identifies, on a per power panel (PP) basis, current drawn from a set of related PPs. The third set of time series data identifies the current drawn from a member of the set of related PPs as one of, a discrete value, and a relative change value. While action 640 is illustrated occurring after the providing of the PDU-device correlation signal at 630, one skilled in the art will appreciate that action 640 may occur before action 630.

Method 600 also includes, at 650, providing a PP-PDU correlation signal that identifies a correlation between current drawn from a member of the set of related PPs and current drawn by a member of the set of related PDUs. In one example, providing the PDU-device correlation signal includes comparing members of the first set of time series data to members of the third set of time series data to correlate current drawn at a PP to current drawn at a PDU. Thus PDU current may be compared to PP current. While comparing the first set and the third set are described, it is to be appreciated that other approaches may be taken. For example, a division and/or mathematical approach similar to that described in connection with method 500 (FIG. 5) may be employed. Additionally, while comparing current is described, one skilled in the art will appreciate that other electrical usage characteristics can be compared.

Figure 7:
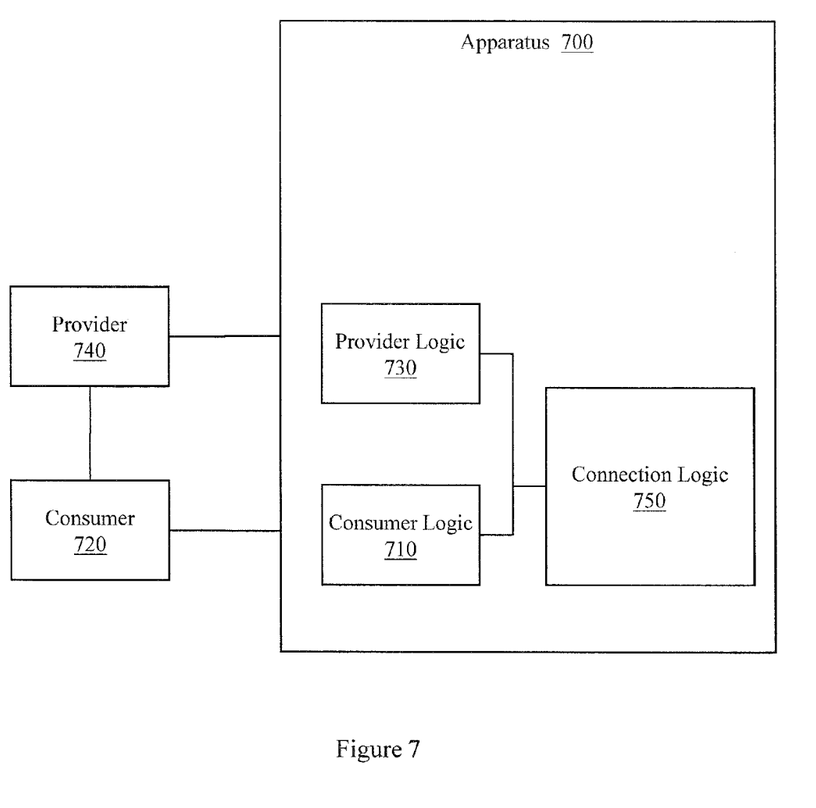
FIG. 7 illustrates an example embodiment of a system associated with automatic power distribution network topology discovery.

FIG. 7 illustrates an apparatus 700 associated with automatically discovering a power distribution network topology. Apparatus 700 includes a consumer logic 710. Consumer logic 710 quantifies a first electrical usage characteristic associated with a downstream electrical consumer. For example, consumer logic 710 may quantify electrical usage associated with consumer 720. Consumer 720 may be, for example, a server.

The first electrical usage characteristic may be voltage, current, and so on. The consumer logic 710 quantifies the first electrical usage characteristic as a discrete value, a difference value, a percent of maximum CPU usage, and so on. The consumer logic 710 may quantify an average associated with the first electrical usage characteristic, a peak associated with the first electrical usage characteristic, an average associated with the first electrical usage characteristic per time interval, a peak associated with the first electrical usage characteristic per time period, and so on. The quantification may be associated with different sampling times and/or different sampling intervals.

Apparatus 700 may also include a provider logic 730. Provider logic 730 quantifies a second electrical usage characteristic associated with an upstream electrical provider 740. The upstream electrical provider 740 may be, for example, a PDU. The second electrical usage characteristic may be, for example, voltage, frequency, current, and so on. The provider logic 730 quantifies the second electrical usage characteristic as a discrete value, a difference value, or so on. The provider logic 730 may quantify an average associated with the second electrical usage characteristic, a peak associated with the second electrical usage characteristic, an average associated with the second electrical usage characteristic per time interval, a peak associated with the second electrical usage characteristic per time period, and so on. The provider logic 730 may characterize the usage characteristic over different time periods, using different time intervals, and different sampling rates.

Apparatus 700 may also include a connection logic 750. Connection logic 750 produces a connection signal associated with a correlation between the first electrical usage characteristic and the second electrical usage characteristic. The connection signal identifies whether the downstream electrical consumer 720 (e.g., server) is a consumer of electricity provided by the upstream electrical provider 740 (e.g., PDU). The connection logic 750 may produce the connection signal by comparing the first electrical usage characteristic to the second electrical usage characteristic, by dividing the first electrical usage characteristic by the second electrical usage characteristic, by dividing the second electrical usage characteristic by the first electrical usage characteristic, by performing other mathematical operations on the usage characteristics, and so on. Since a device may be configured with multiple power supplies, and since redundancy may be a goal in a data center, one skilled in the art will appreciate that the connection signal may identify two or more PDUs that are connected to a device.

Figure 8:
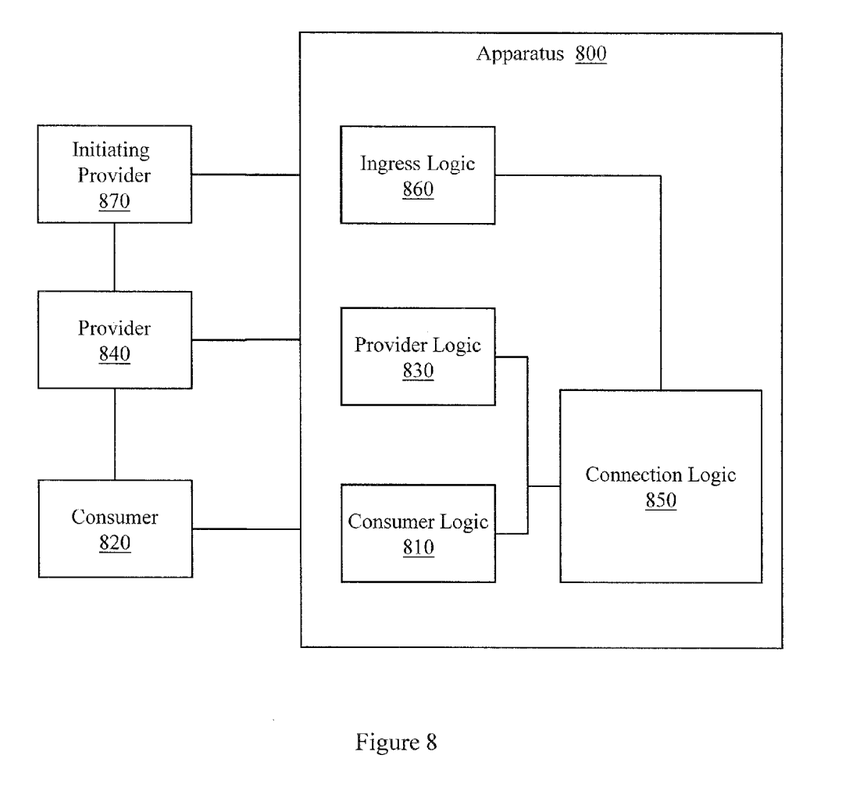
FIG. 8 illustrates an example embodiment of a system associated with automatic power distribution network topology discovery.

FIG. 8 illustrates an apparatus 800 associated with automatically discovering a power distribution network topology. Apparatus 800 includes a consumer logic 810 and a provider logic 830 similar to the consumer logic 710 and provider logic 730 of apparatus 700 (FIG. 7). These logics quantify electrical usage characteristics (e.g., power, current, voltage, frequency) for a consumer 820 and a provider 840.

However, a datacenter or other arrangement of electrical producers and consumers may have more than two levels. Thus, apparatus 800 includes an ingress logic 860 that quantifies a third electrical usage characteristic associated with an initiating electrical provider 870. Since the system 800 is receiving data with three levels of a power distribution network, connection logic 850 may produce an initiation signal associated with a correlation between the second electrical usage characteristic and the third electrical usage characteristic. This initiation signal identifies whether the upstream electrical provider 840 is a consumer of electricity provided by the initiating electric provider 870. While three levels of power distribution and power consumption elements are provided, one skilled in the art will appreciate that system 800 could be extended beyond three levels.

Figure 9:
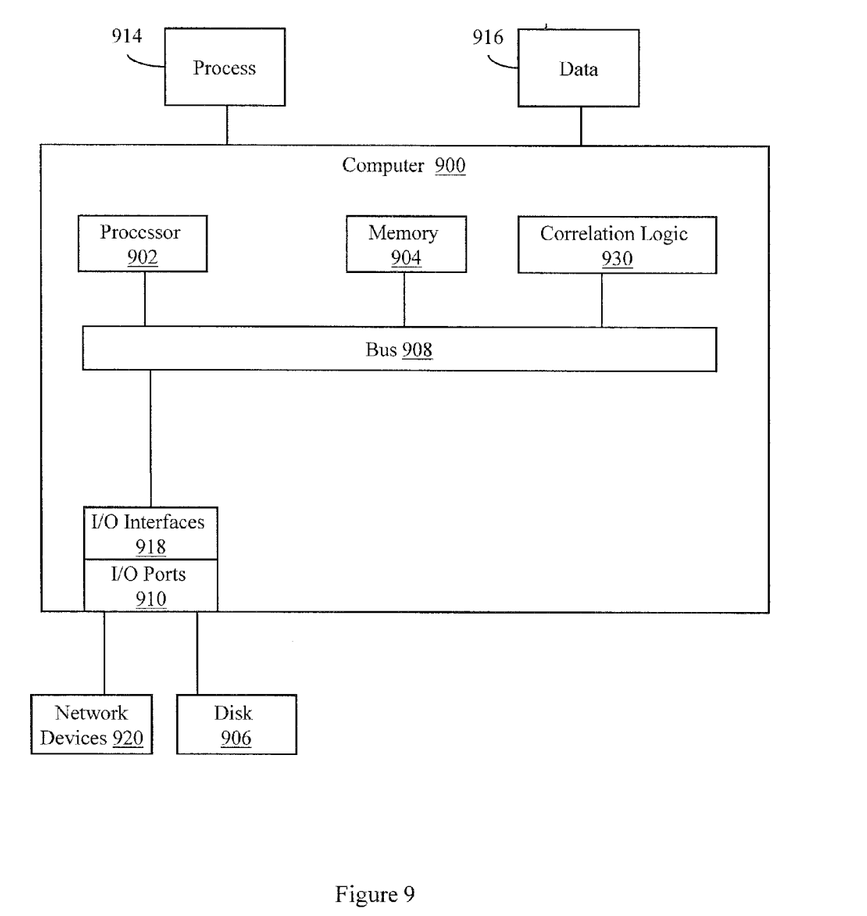
FIG. 9 illustrates an example embodiment of a computing environment in which example systems and methods, and equivalents, may operate.

FIG. 9 illustrates an example computing device in which example systems and methods described herein, and equivalents, may operate. The example computing device may be a computer 900 that includes a processor 902, a memory 904, and input/output ports 910 operably connected by a bus 908. In one example, the computer 900 may include a correlation logic 930 configured to facilitate automatically discovery a power topology. In different examples, the logic 930 may be implemented in hardware, software, firmware, and/or combinations thereof. While the logic 930 is illustrated as a hardware component attached to the bus 908, it is to be appreciated that in one example, the logic 930 could be implemented in the processor 902.

Thus, logic 930 may provide means (e.g., hardware, software, firmware) for measuring a consumption of a resource at a resource consumer. Most generally the resource consumer is a member of a set of related resource consumers. More specifically, the resource consumer may be a server, network device, or storage device in a datacenter and the resource may be electricity as measured by current, power, frequency, voltage, and so on. Logic 930 may also provide means (e.g., hardware, software, firmware) for measuring a provision of a resource at a resource provider. Most generally the resource provider is a member of a set of related resource providers. More specifically, the resource provider may be a PDU in the datacenter. Logic 930 may also provide means (e.g., hardware, software, firmware) for determining whether the resource consumer consumed a resource provided by the resource provider. For example, the logic 930 may determine whether a device consumed electricity provided by a PDU. Logic 930 may make the determination based on comparing the consumption of the resource at the resource consumer and the provision of the resource at the resource provider. For example, a power consumption signature associated with a server may be compared to a current drawn signature associated with a PDU to determine the correlation.

The means may be implemented, for example, as an ASIC. The means may also be implemented as computer executable instructions that are presented to computer 900 as data 916 that are temporarily stored in memory 904 and then executed by processor 902.

Generally describing an example configuration of the computer 900, the processor 902 may be a variety of various processors including dual microprocessor and other multi-processor architectures. A memory 904 may include volatile memory and/or non-volatile memory. Non-volatile memory may include, for example, ROM, PROM, and so on. Volatile memory may include, for example, RAM, SRAM, DRAM, and so on.

A disk 906 may be operably connected to the computer 900 via, for example, an input/output interface (e.g., card, device) 918 and an input/output port 910. The disk 906 may be, for example, a magnetic disk drive, a solid state disk drive, a floppy disk drive, a tape drive, a Zip drive, a flash memory card, a memory stick, and so on. Furthermore, the disk 906 may be a CD-ROM drive, a CD-R drive, a CD-RW drive, a DVD ROM, and so on. The memory 904 can store a process 914 and/or a data 916, for example. The disk 906 and/or the memory 904 can store an operating system that controls and allocates resources of the computer 900.

The bus 908 may be a single internal bus interconnect architecture and/or other bus or mesh architectures. While a single bus is illustrated, it is to be appreciated that the computer 900 may communicate with various devices, logics, and peripherals using other busses (e.g., PCIE, 1394, USB, Ethernet). The bus 908 can be types including, for example, a memory bus, a memory controller, a peripheral bus, an external bus, a crossbar switch, and/or a local bus.

The computer 900 may interact with input/output devices via the i/o interfaces 918 and the input/output ports 910. Input/output devices may be, for example, a keyboard, a microphone, a pointing and selection device, cameras, video cards, displays, the disk 906, the network devices 920, and so on. The input/output ports 910 may include, for example, serial ports, parallel ports, and USB ports.

The computer 900 can operate in a network environment and thus may be connected to the network devices 920 via the i/o interfaces 918, and/or the i/o ports 910. Through the network devices 920, the computer 900 may interact with a network. Through the network, the computer 900 may be logically connected to remote computers. Networks with which the computer 900 may interact include, but are not limited to, a LAN, a WAN, and other networks.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. A computer-readable medium storing computer-executable instructions that when executed by a computer control the computer to perform a method, the method comprising:
storing a first set of time series data that identifies, on a per power distribution unit (PDU) basis, a level of current drawn from a set of related PDUs;
storing a second set of time series data that identifies, on a per device basis, a level of power used by a set of related devices;
aligning acquisition time information available in the first set of time series data and acquisition time information available in the second set of time series data to identify a correlation between current drawn from a member of the set of related PDUs and power used by a member of the set of related devices; and
providing a PDU-device correlation signal that identifies the correlation.

2. The computer-readable medium of claim 1, further comprising providing a PDU-device correlation signal that identifies a connection between one PDU from the set of related PDUs and one device from the set of related devices by one or more of, a power load phase, and a panel breaker pole as a function of correlating a suspected power event and an actual power event based in part on PDU event data.

3. The computer-readable medium of claim 1, where the first set of time series data identifies a level of current drawn on a per-PDU per-outlet basis, and
where the PDU-device correlation signal identifies a correlation between current drawn from an outlet on a member of the set of related PDUs and power used by a member of the set of related devices.

4. The computer-readable medium of claim 1, where a member of the first set of time series data identifies the level of current drawn by a member of the set of related PDUs as one of, a discrete value, and a relative change value and where a member of the second set of time series data identifies the level of power used by a member of the set of related devices as one of, a discrete value, a relative change value, and a percentage of maximum central processing unit (CPU) usage.

5. The computer-readable medium of claim 1, where aligning acquisition time information includes comparing members of the first set of time series data to members of the second set of time series data to correlate current drawn to power used.

6. The computer-readable medium of claim 5, where comparing members of the first set of time series data to members of the second set of time series data comprises one or more of, pattern recognition, and pattern matching.

7. The computer-readable medium of claim 1, the method comprising:
computing a third set of time series data from the first set of time series data and the second set of time series data, and
where the PDU-device correlation signal depends on an analysis of the third set of time series data.

8. The computer-readable medium of claim 7, where computing the third set of time series data includes performing a division that involves elements of the first set of time series data and elements of the second set of time series data.

9. The computer-readable medium of claim 1, the method comprising:
storing a third set of time series data that identifies, on a per power panel (PP) basis, a level of current drawn from a set of related PPs; and
providing a PP-PDU correlation signal that identifies a correlation between current drawn from a member of the set of related PPs and current drawn by a member of the set of related PDUs.

10. The computer-readable medium of claim 1, where the PDU-device correlation signal identifies whether a device is receiving power from two or more PDUs.

11. The computer-readable medium of claim 9, where providing the PDU-device correlation signal comprises comparing members of the first set of time series data to members of the third set of time series data to correlate current drawn at a PP to current drawn at a PDU.

12. An apparatus, comprising:
a consumer logic to quantify a first electrical usage characteristic associated with a downstream electrical consumer;
a provider logic to quantify a second electrical usage characteristic associated with an upstream electrical provider; and
a connection logic to align acquisition time information available from the first electrical usage characteristic and acquisition time information available from the second electrical usage characteristic to produce a connection signal that identifies whether a correlation between the first electrical usage characteristic and the second electrical usage characteristic identifies the downstream electrical consumer as a consumer of electricity provided by the upstream electrical provider.

13. The apparatus of claim 12,
where the downstream electrical consumer is a device in a datacenter;
where the upstream electrical provider is a PDU in the datacenter;
where the first electrical usage characteristic is one or more of, voltage, frequency, and current;
where the consumer logic quantifies the first electrical usage characteristic as one or more of, a discrete value, a difference value, and a percent of maximum CPU usage;
where the consumer logic quantifies one or more of, an average associated with the first electrical usage characteristic, a peak associated with the first electrical usage characteristic, an average associated with the first electrical usage characteristic per time interval, and a peak associated with the first electrical usage characteristic per time period;
where the second electrical usage characteristic is one or more of, voltage, frequency, and current;
where the provider logic quantifies the second electrical usage characteristic as one or more of, a discrete value, and a difference value;
where the provider logic quantifies one or more of, an average associated with the second electrical usage characteristic, a peak associated with the second electrical usage characteristic, an average associated with the second electrical usage characteristic per time interval, and a peak associated with the second electrical usage characteristic per time period; and where the connection logic produces the connection signal according to one or more of, a comparison of the first electrical usage characteristic to the second electrical usage characteristic, and a division involving the first electrical usage characteristic and the second electrical usage characteristic.

14. The apparatus of claim 12, comprising:

an ingress logic to quantify a third electrical usage characteristic associated with an initiating electrical provider, and where the connection logic is to produce an initiation signal that identifies whether a correlation between the second electrical usage characteristic and the third electrical usage characteristic identifies the upstream electrical provider as a consumer of electricity provided by the initiating electric provider.

15. A system, comprising:

means for measuring a consumption of a resource at a resource consumer, where the resource consumer is a member of a set of related resource consumers;

means for measuring a provision of a resource at a resource provider, where the resource provider is a member of a set of related resource providers; and means for determining whether the resource consumer consumed a resource provided by the resource provider by aligning acquisition time information relating to the consumption of the resource at the resource consumer and acquisition time information relating to the provision of the resource at the resource provider.

* * * * *